(12) United States Patent
Freund et al.

(10) Patent No.: US 6,267,282 B1
(45) Date of Patent: Jul. 31, 2001

(54) METHOD AND APPARATUS FOR HANDLING LASER BARS

(75) Inventors: Joseph Michael Freund, Fogelsville; William Andrew Gault, Mohnton; George John Przybylek, Douglasville; Dennis Mark Romero, Allentown; John William Stayt, Jr., Schnecksville, all of PA (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/285,009

(22) Filed: Apr. 1, 1999

(51) Int. Cl.[7] ........................................... B26F 3/00
(52) U.S. Cl. .............................. 225/1; 225/2; 225/4; 225/5
(58) Field of Search .......................... 225/2, 5, 1, 96.5, 225/4; 438/33, 462, FOR 386; 148/DIG. 95, DIG. 28; 125/24, 23.01

(56) References Cited

U.S. PATENT DOCUMENTS

| | | | |
|---|---|---|---|
| 3,182,873 | * 5/1965 | Kalvelage et al. | 225/96.5 |
| 3,493,155 | * 2/1970 | Litant et al. | 225/2 |
| 3,727,282 | * 4/1973 | Neary | 225/2 |
| 3,790,051 | * 2/1974 | Moore | 225/1 |
| 4,995,539 | * 2/1991 | Richard | 225/2 |
| 5,037,776 | * 8/1991 | Galeuchet et al. | 148/DIG. 95 |
| 5,069,195 | * 12/1991 | Barozzi | 125/23.01 |
| 5,310,104 | * 5/1994 | Zaidel et al. | 225/2 |
| 5,486,490 | * 1/1996 | Kakimoto | 437/129 |
| 5,814,531 | * 9/1998 | Anayama et al. | 438/31 |
| 5,829,658 | * 11/1998 | Colombani | 225/1 |
| 5,852,624 | * 12/1998 | Matsuyama et al. | 438/33 |
| 6,024,631 | * 2/2000 | Piper | 125/23.01 |
| 6,080,602 | * 6/2000 | Tani et al. | 438/114 |

\* cited by examiner

Primary Examiner—Rinaldi I. Rada
Assistant Examiner—Omar Flores-Sánchez
(74) Attorney, Agent, or Firm—Dickstein Shapiro Morin & Oshinsky LLP

(57) ABSTRACT

An apparatus is provided for cleaving a laser bar into semiconductor chips. The apparatus includes a supporting structure on which a member slides. The apparatus also includes a pair of film layers. The laser bar is positioned between the film layers. A chamber is sealed to the top film layer. The chamber has an inlet through which gas is input. The movement of the member and the downward force caused by the buildup of gas pressure in the chamber induce cleaving of the laser bar at predetermined locations. The laser bar may have score marks at the predetermined locations to produce weak points. Pressure pulses may be coordinated with the movement of the member to break the laser bar at the desired locations.

15 Claims, 5 Drawing Sheets

METHOD AND APPARATUS FOR HANDLING LASER BARS

FIELD OF THE INVENTION

The present invention relates to the production of semiconductor chips. The present invention also relates to a system for handling brittle workpieces such as laser bars. More particularly, the present invention relates to a method and an apparatus for cleaving a laser bar into semiconductor chips.

BACKGROUND OF THE INVENTION

There are currently several different apparatus and methods used to cleave a laser bar into discrete semiconductor chips. One known method involves the use of mechanically applied pressure to a laser bar. By this method, a laser bar is grasped by a mechanical device at opposing places and a force is directed at both opposing places, creating a plane of stress at which ultimately the laser bar is broken. The use of mechanically applied pressure in this manner, however, sometimes provides an uneven, ragged cleave edge.

Another method involves passing a high velocity stream of gas over the laser bar to induce cleavage. There is an ergonomic disadvantage to this method in that it is noisy. A further disadvantage is that a large volume of gas is required to induce cleavage.

SUMMARY OF THE INVENTION

The present invention provides an apparatus for cleaving a laser bar. The apparatus includes a support, at least one flexible barrier, a movable member positioned between the support and the flexible barrier, and a chamber for exerting pressure on the flexible barrier. The chamber is located on the flexible barrier and it has an outer periphery. The laser bar is moved between the support and the flexible barrier within the outer periphery of the chamber to apply bending forces to the laser bar.

In a preferred embodiment of the invention, the laser bar has a plurality of score marks to induce cleaving at the score marks.

In another preferred embodiment of the invention, the pressure includes a force induced by gas pressure in the chamber.

In another preferred embodiment of the invention, the member is left stationary and two film layers, one positioned above and the other below the laser bar, are moved over the member to apply bending forces on the laser bar.

The present invention also provides a method of cleaving a laser bar into chips. The method includes the steps of positioning a movable member between a flexible barrier and a supporting structure, locating a laser bar between the flexible barrier and the movable plate, sealing a chamber to the flexible barrier, exerting a pressure on the laser bar, and moving the member along the supporting structure. The movement and the pressure cause the laser bar to cleave into chips.

In a preferred embodiment of the invention, the downward force includes gas pressure and the gas is introduced to the chamber in pulses.

An object of the present invention is to provide an energy efficient and low noise method and apparatus for cleaving a semiconductor bar into discrete chips.

Another object of the present invention is to provide an apparatus and method for cleaving a semiconductor bar to create clean cleave edges.

Another object of the present invention is to provide an apparatus and method for cleaving a semiconductor bar which does not require a large volume of gas.

These and other advantages will become apparent from the following detailed description of preferred embodiments of the invention.

DETAILED DESCRIPTION OF PREFERRED EMBODIMENTS

Figure 1:
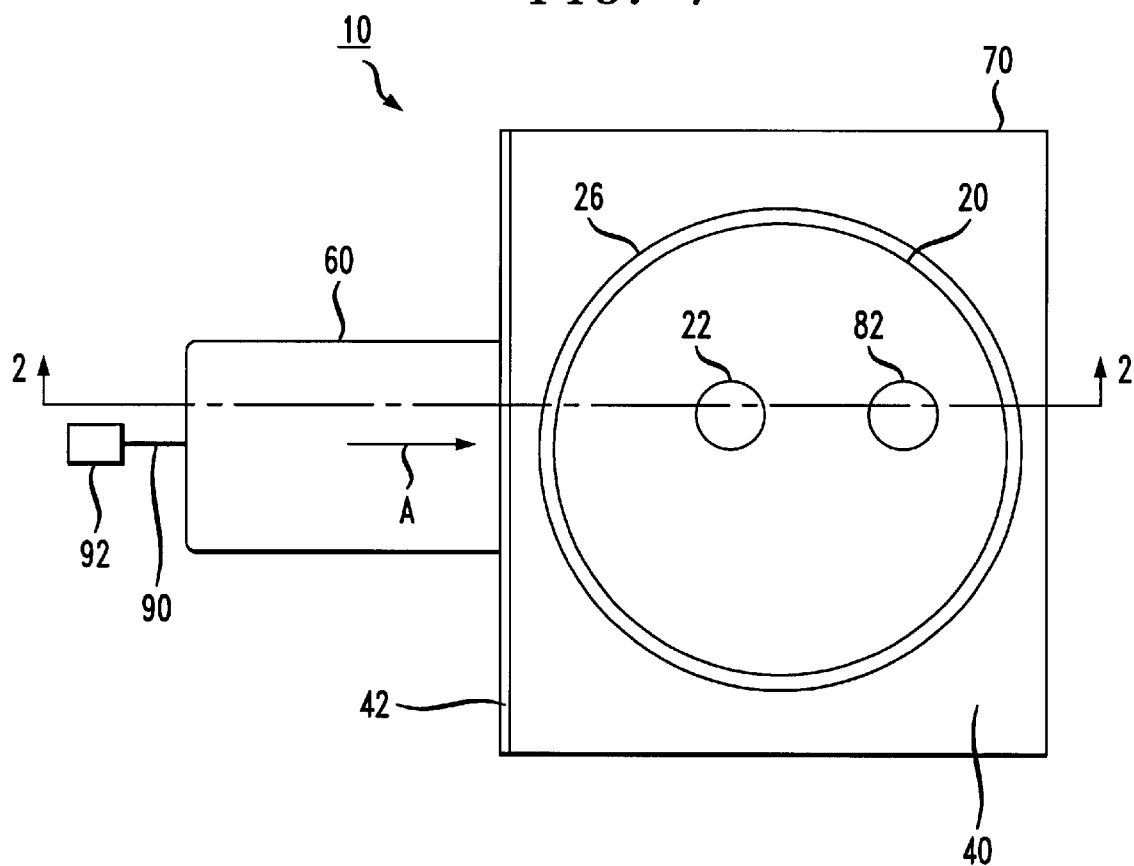
FIG. 1 is a top view of a laser bar cleaving apparatus constructed in accordance with a preferred embodiment of the present invention.
Figure 2:
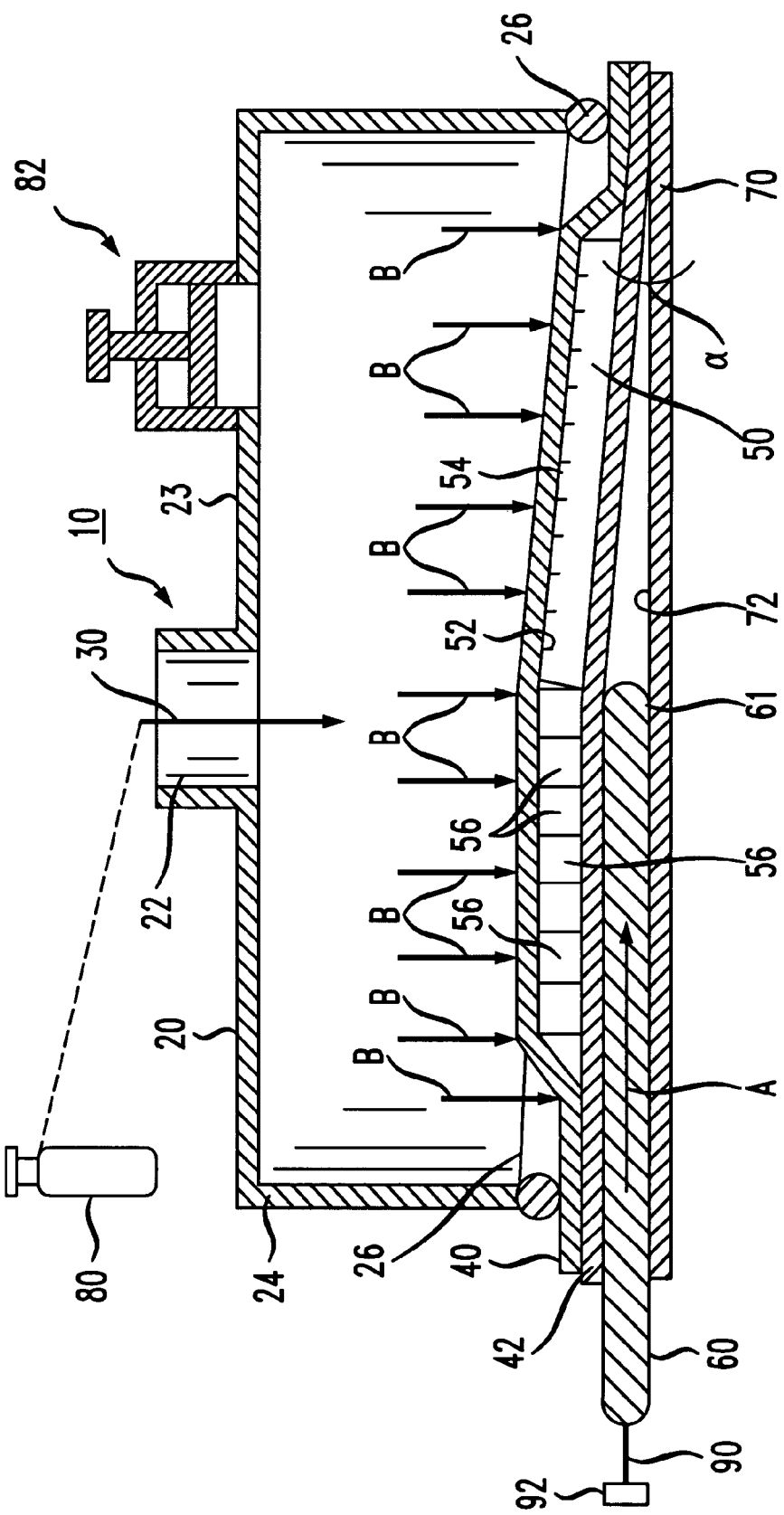
FIG. 2 is a cross-sectional view of the laser bar cleaving apparatus of FIG. 1 taken along line 2—2.

Referring now to the drawings, where like numerals designate like elements, there is shown in FIGS. 1–2 an apparatus 10 for cleaving a laser bar 50 into discrete semiconductor chips 56. The apparatus 10 has an outer periphery generally defined by a side wall 24. Further, the apparatus 10 includes a top wall 23. An inlet 22 is located in the top wall 23. At a lower portion of the side wall 24 is positioned a sealing structure 26. Any suitable material for sealing may be used to make the sealing structure 26, such as, for example, an O-ring.

Positioned directly beneath the sealing structure 26 are a pair of film layers 40, 42. The film layers 40, 42 may be made of a material which does not slide well against itself, but which will allow relatively frictionless movement of an object made from another material along its surface. Preferably, the film layers 40, 42 are made of Mylar®, although they may alternatively be formed of vinyl or Tyvek® or other materials.

A laser bar 50 is positioned between the top film layer 40 and the bottom film layer 42. The laser bar 50 has a top surface 54 in which there are score marks, or ticks, 52. The laser bar 50 is formed of a brittle material having a crystalline structure.

Positioned between the lower film layer 42 and a supporting structure 70 is a movable member 60. Specifically, the member 60 moves along a top surface 72 of the supporting structure 70. As shown in FIG. 2, the movement is in the direction of arrow A; however, the movement may be in a direction opposite to direction A. The member 60 shown in FIGS. 2, 3 has a curved end 61. The curved end 61 assists in moving the member 60 along the surface 72. The member 60 is operated, via a connector 90, by a moving structure 92. The moving structure 92 may be a servo-mechanical device, a pneumatic or hydraulic driven device, or other structure suitable for moving the member 60.

Figure 5:
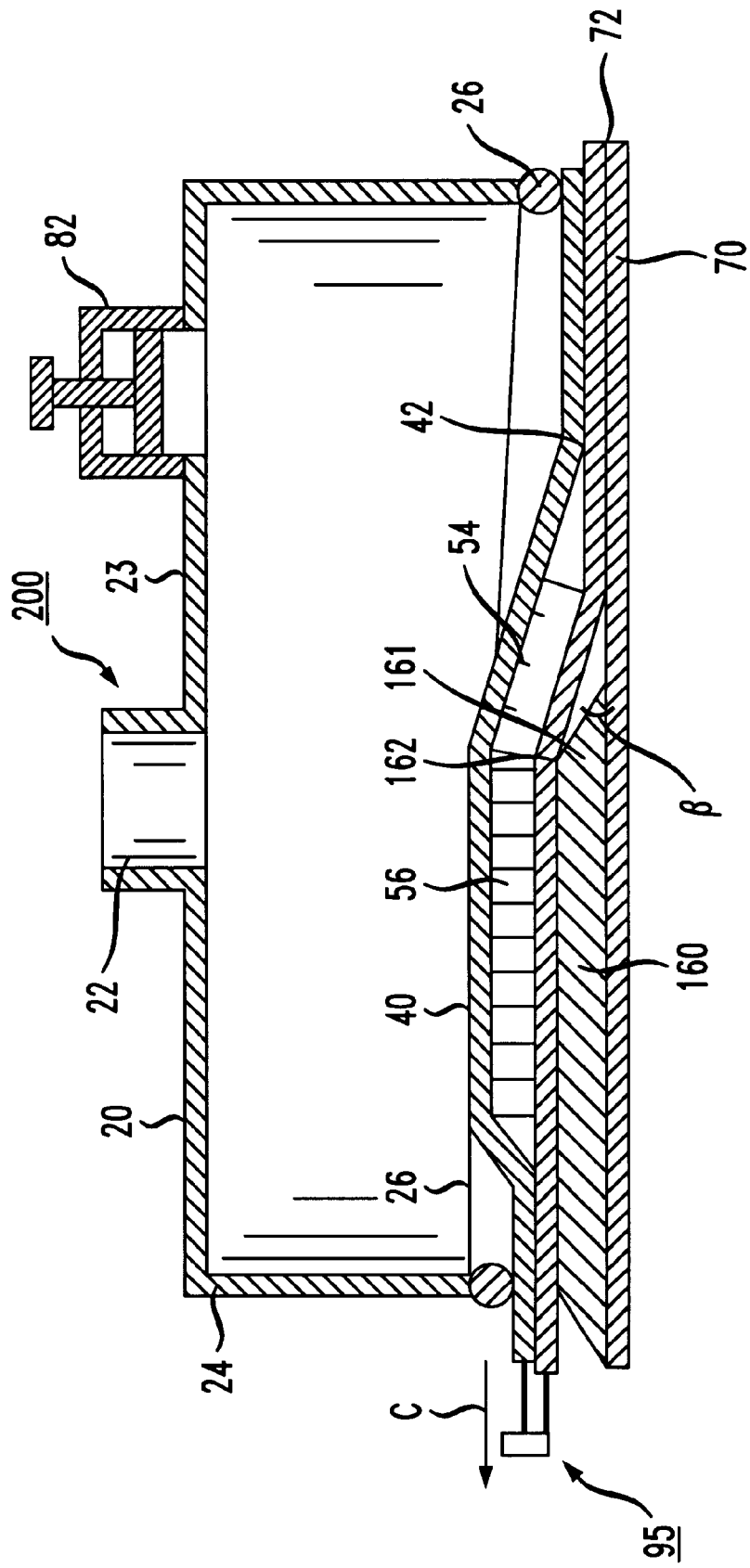
FIG. 5 is a cross-sectional view of a laser bar cleaving apparatus constructed in accordance with another preferred embodiment of the present invention.

The member may, however, have another geometry at its end. For example, as shown in FIG. 5, a member 160 may be used having a wedge-shaped end 161, which, like end 61, assists in moving the member 160 along the surface 72. The chips 56 become cleaved from the bar 50 at or about a cleave point 162 on the member 160. The angle β is an angle suitable to promote cleavage of the chips 56 from the bar 50. A preferred angle may be about four degrees.

In operation, the movable member 60 is located between the lower film layer 42 and the supporting structure 70. The member 60 causes the laser bar 50 to be at an angle α (FIG. 2) with respect to the supporting structure 70. Increased bending stress is produced on the laser bar 50 adjacent to the end 61 of the member 60 due to the angle α.

A gas 30 is input into the chamber 20 through the inlet 22. The gas may be any suitable gas, such as air, nitrogen, carbon dioxide, argon, or helium. The gas may be supplied by a suitable source 80, such as, for example, a gas cylinder. The presence of the sealing structure 26 prevents the gas from escaping from the chamber 20. Further, the inlet 22 may be fitted with a one-way valve (not shown) to prevent the gas 30 from reentering the inlet 22 and leaking from the chamber 20. With the addition of the gas 30 to the chamber 20, a buildup of pressure due to the presence of the gas 30 is created. This gas pressure buildup creates a downward force, designated schematically by arrows B, on the top film layer 40.

The downward force B from the gas pressure, in conjunction with the increased bending stress on the laser bar 50 adjacent the end 61 of the movable member 60, induce the laser bar 50 to be cleaved into discrete semiconductor chips 56. The score marks 52 create weak points along the length of the laser bar 50, thereby leading to cleavage of the laser bar 50 at the score marks 52.

As the member 60 moves further into the interior of the chamber 20, the stress point on the laser bar 50 moves down the length of the laser bar 50. Specifically, as the member 60 moves, each chip 56 is sequentially cleaved from the laser bar 50. Once the laser bar 50 has been cleaved completely into semiconductor chips 56, the member 60 may be moved in a direction opposite direction A so as to be removed from in between the lower film layer 42 and the supporting structure 70. The member 60 may then be completely removed from the outer periphery of the chamber 20, if desired. It is not, however, necessary to remove the member 60 from the chamber 20, but only to release the pressure within the chamber 20. Once the pressure has been released, the seal at the sealing structure 26 may be broken. The chamber 20 may then be removed and the film layers 40, 42, along with the discrete semiconductor chips 56 may be removed for further processing. The chips 56 may be handled individually by suitable pick and place equipment, for example.

The gas 30 may be input into the chamber 20 at a constant rate. Alternatively, the gas 30 may be input in pulses, thereby momentarily increasing the gas pressure, and thereby increasing the downward force B, on the laser bar 50. The pulses may be timed to coincide with the movement of the end 61 close to points beneath the respective score marks 52. Alternatively, the pulses may be provided in rapid succession such that each portion of the laser bar 50 to become the chip 56 receives numerous pulses as the member 60 moves, any one or more of the pulses causing cleavage. In this way, the laser bar 50 may be efficiently and cleanly cleaved at the score marks 52 into semiconductor chips 56. A mechanical device, such as a reciprocating piston 82 (FIG. 2), may be used to create pressure pulses in the chamber 20, thereby momentarily increasing the pressure on the laser bar 50 to a much higher level.

In the illustrated embodiment, visual inspection will show that the edges of the chips 56 are clean and aligned with the crystalline plane. The cleave edges of the chips 56 will be cleaner than those produced by the mechanical cleaving devices described in the Background of the Invention section of this application.

Additionally, the apparatus 10 provides an energy efficient way to cleave the laser bars 50, and it does so cleanly, with low noise, and with a much smaller usage of gas. Since less gas 30 is used, the apparatus 10 can utilize an uncomplicated gas delivery system. Small diameter gas supply tubes (not shown) may be used, for example.

Figure 3:
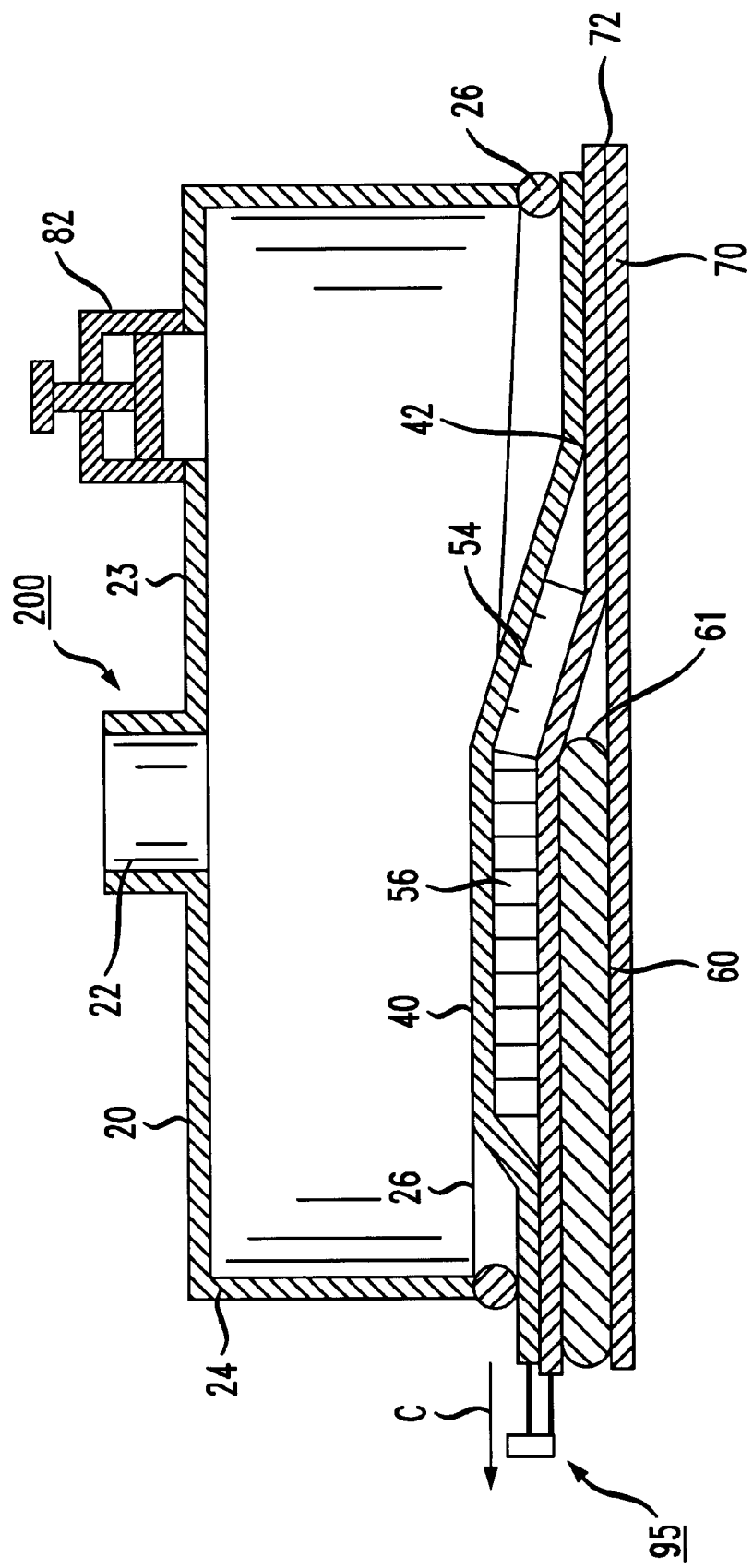
FIG. 3 is a cross-sectional view of a laser bar cleaving apparatus constructed in accordance with another preferred embodiment of the present invention.

Referring now to FIG. 3, another preferred embodiment of the invention is shown. Specifically, the apparatus 200 is shown having identical features as the apparatus 10 except as now discussed. Instead of moving the member 60, the member 60 is left stationary and the film layers 40, 42 are moved. Specifically, a moving structure 95 is connected to the film layers 40, 42 and adapted to pull the film layers 40, 42 in the direction of arrow C. As the layers 40, 42 move over the member 60, the laser bar 50 also moves over the member 60, becoming sequentially cleaved into chips 56.

Figure 4:
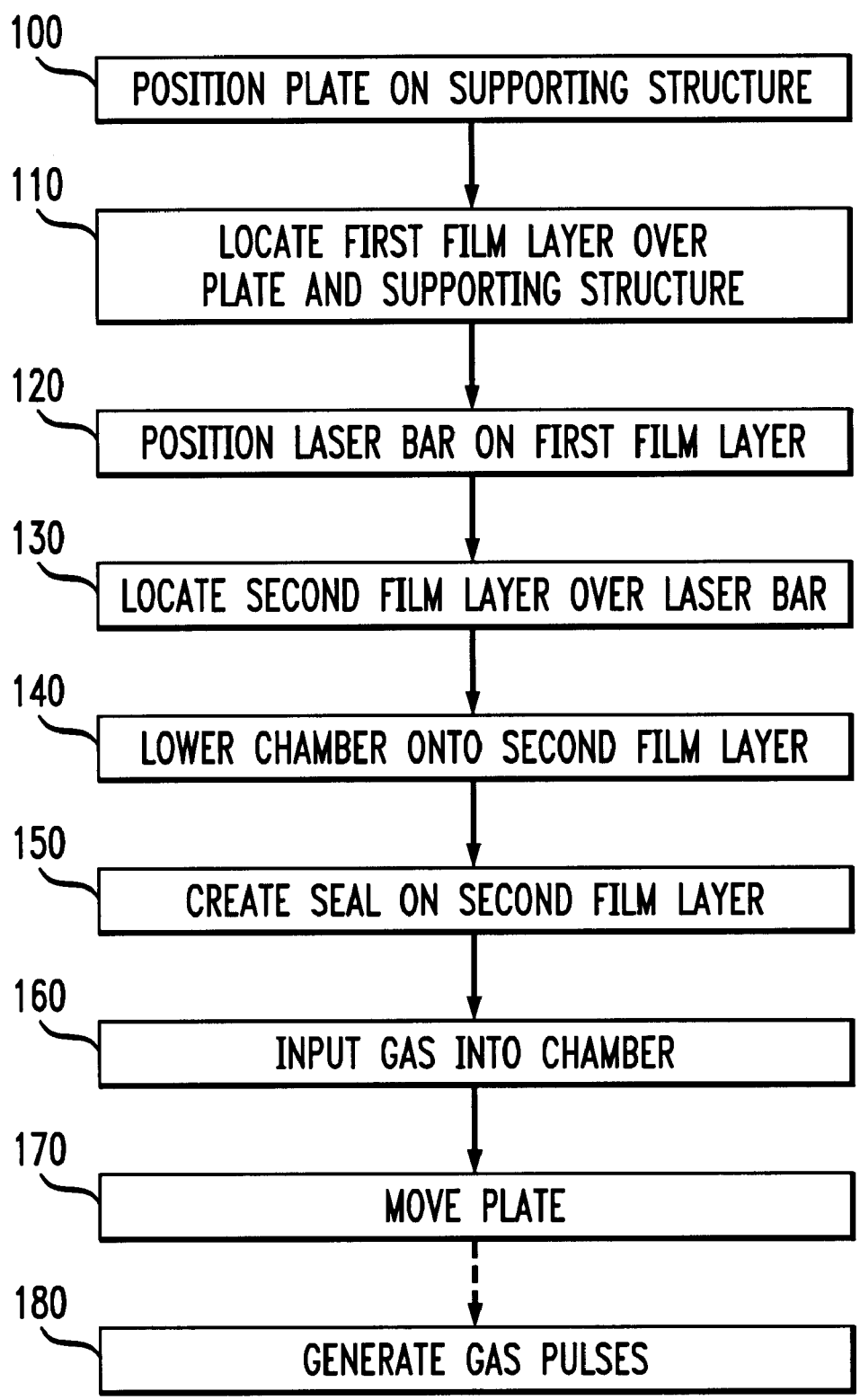
FIG. 4 is a flow diagram of the laser bar cleaving apparatus of FIG. 1.

With reference to FIG. 4, the assembly and method of use of the apparatus 10 is shown. In Step 100, the member 60 is positioned on the supporting structure 70. If, as shown in FIG. 2, the member 60 is to move in direction A, the member 60 should be positioned toward the left side of the supporting structure 70.

The bottom film layer 42 is located over the member 60 and the supporting structure 70 in Step 110. In Steps 120 and 130, the laser bar 50 is positioned on the film layer 42 and then the top film layer 40 is positioned on the laser bar 50.

The chamber 20 is lowered into contact with the top film layer 40 in Step 140. The chamber 20 may be moved downward toward the supporting structure 70. Alternatively, the supporting structure 70 may be raised until the film layer 40 comes into contact with the chamber seal 26. In Step 150, the seal 26 is created between the film layer 140 and the chamber 20.

In Step 160, a gas 30 is input into the chamber 20 to create the downward force B, and in Step 170, the member 60 is moved. An optional step, Step 180, is generating gas pulses. As discussed above, the pulses may be generated by a reciprocating piston 82.

The present invention provides an apparatus and a method for cleanly and efficiently cleaving a laser bar into discrete semiconductor chips. The apparatus includes the use of a chamber, a pair of film layers, a movable plate, and a supporting structure. The chamber includes a sealing structure and an inlet for receiving a gas. Modifications can be made to the invention and equivalents substituted for described and illustrated structures without departing from the spirit or scope of the invention. For example, although the operation of apparatus 10 has been described in terms of cleaving a laser bar 50, the apparatus 10 may be used to cleave other relatively brittle workpieces, both crystalline and noncrystalline, such as glass. Accordingly, the scope of the present invention is not to be considered as limited by the specifics of the particular structure which have been described and illustrated, but is only limited by the scope of the appended claims.

What is claimed as new and desired to be protected by Letters Patent of the United States is:

1. A method of cleaving a laser bar into chips, said method comprising the steps of:

positioning a movable member between a flexible barrier and a supporting structure;

locating a laser bar between said flexible barrier and said movable member;

sealing a chamber to said flexible barrier;

using said chamber to exert pressure on the laser bar by inputting a gas into said chamber, wherein said chamber is pressurized above atmospheric pressure;

generating pressure pulses in said chamber; and moving said member in a direction transverse to the direction of said exerted pressure.

2. The method of claim 1, wherein said gas is input from a gas cylinder.

3. The method of claim 1, wherein said gas is air.

4. The method of claim 1, wherein said pulses are generated by a reciprocating piston.

5. The method of claim 1, further comprising the step of cleaving the laser bar at score marks.

6. The method of claim 1, wherein said moving of said member is in a direction perpendicular to the pressure.

7. The method of claim 6, wherein said member is moved along a surface of said supporting structure.

8. A method of cleaving a laser bar into chips, the method comprising the steps of:

providing a laser bar with at least one reduced thickness portion;

locating the laser bar between first and second layers of film;

positioning a movable member between said second layer and a supporting structure;

sealing a chamber to said first layer of film;

inputting a gas into said chamber to apply gas pressure to said first layer;

generating pressure pulses in said chamber; and moving said member in a direction transverse to the direction of said exerted pressure.

9. The method of claim 8, wherein the laser bar is cleaved at said reduced thickness portion.

10. The method of claim 9, wherein said chamber is pressurized above atmospheric pressure.

11. The method of claim 9, wherein said gas is input from a gas cylinder.

12. The method of claim 8, wherein said gas is air.

13. The method of claim 8, wherein said pulses are generated by a reciprocating cylinder.

14. The method of claim 8, wherein said moving of said member is in a direction perpendicular to the pressure.

15. The method of claim 14, wherein said member is moved along a surface of said supporting structure.

* * * * *